United States Patent
Kim et al.

(10) Patent No.: US 9,530,753 B2
(45) Date of Patent: Dec. 27, 2016

(54) INTEGRATED CIRCUIT PACKAGING SYSTEM WITH CHIP STACKING AND METHOD OF MANUFACTURE THEREOF

(75) Inventors: DaeSup Kim, SujungGu (KR); YoungJoon Kim, Ichon-si (KR); DaeSik Choi, Seoul (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 556 days.

(21) Appl. No.: 13/243,474

(22) Filed: Sep. 23, 2011

(65) Prior Publication Data

US 2013/0075915 A1 Mar. 28, 2013

(51) Int. Cl.
| | |
|---|---|
| *H01L 23/24* | (2006.01) |
| *H01L 25/065* | (2006.01) |
| *H01L 23/00* | (2006.01) |
| *H01L 23/31* | (2006.01) |
| *H01L 25/03* | (2006.01) |
| *H01L 25/10* | (2006.01) |

(52) U.S. Cl.
CPC ............. *H01L 25/065* (2013.01); *H01L 24/16* (2013.01); *H01L 24/73* (2013.01); *H01L 24/81* (2013.01); *H01L 24/92* (2013.01); *H01L 23/3128* (2013.01); *H01L 24/13* (2013.01); *H01L 24/32* (2013.01); *H01L 24/48* (2013.01); *H01L 25/03* (2013.01); *H01L 25/105* (2013.01); *H01L 2224/131* (2013.01); *H01L 2224/16057* (2013.01); *H01L 2224/16105* (2013.01); *H01L 2224/16108* (2013.01); *H01L 2224/16225* (2013.01); *H01L 2224/16227* (2013.01); *H01L 2224/32145* (2013.01); *H01L 2224/32225* (2013.01); *H01L 2224/48227* (2013.01); *H01L 2224/73253* (2013.01); *H01L 2224/73265* (2013.01); *H01L 2224/81191* (2013.01); *H01L 2224/81815* (2013.01); *H01L 2224/92225* (2013.01); *H01L 2224/92242* (2013.01); *H01L 2225/06517* (2013.01); *H01L 2225/06558* (2013.01); *H01L 2924/15311* (2013.01); *H01L 2924/181* (2013.01); *H01L 2924/1815* (2013.01)

(58) Field of Classification Search
CPC .. H01L 25/071; H01L 25/072; H01L 25/0652; H01L 25/0657; H01L 2224/48137; H01L 2224/48145; H01L 2224/16145
USPC .......... 257/686, 723, 777, 778; 438/107–109, 438/127
See application file for complete search history.

(56) References Cited

U.S. PATENT DOCUMENTS

| | | | |
|---|---|---|---|
| 5,963,793 A | * | 10/1999 | Rinne ................ H01L 24/10 257/E23.021 |
| 6,383,839 B2 | | 5/2002 | Kinsman |
| 6,828,665 B2 | | 12/2004 | Pu et al. |
| 7,354,800 B2 | | 4/2008 | Carson |
| 7,365,427 B2 | | 4/2008 | Lu et al. |

(Continued)

OTHER PUBLICATIONS

U.S. Appl. No. 12/946,841, filed Nov. 15, 2010, Cho et al.

*Primary Examiner* — Matthew E Warren
(74) *Attorney, Agent, or Firm* — Wong & Rees LLP

(57) ABSTRACT

A method of manufacture of an integrated circuit packaging system includes: providing a first substrate; mounting an integrated circuit structure on the first substrate; mounting a second substrate on the integrated circuit structure; coupling a vertical chip to the first substrate and to the second substrate; and forming a package body for encapsulating the integrated circuit structure, the vertical chip, and a portion of the second substrate.

20 Claims, 6 Drawing Sheets

(56) References Cited

U.S. PATENT DOCUMENTS

| | | |
|---|---|---|
| 7,772,685 B2 | 8/2010 | Huang et al. |
| 8,058,717 B2 * | 11/2011 | Takano .......................... 257/686 |
| 2007/0007643 A1 * | 1/2007 | Oh et al. ....................... 257/701 |
| 2007/0111386 A1 | 5/2007 | Kim et al. |
| 2008/0315388 A1 * | 12/2008 | Periaman ............ H01L 25/0652 257/690 |
| 2009/0283870 A1 * | 11/2009 | Pagaila .................. H01L 21/56 257/620 |

* cited by examiner

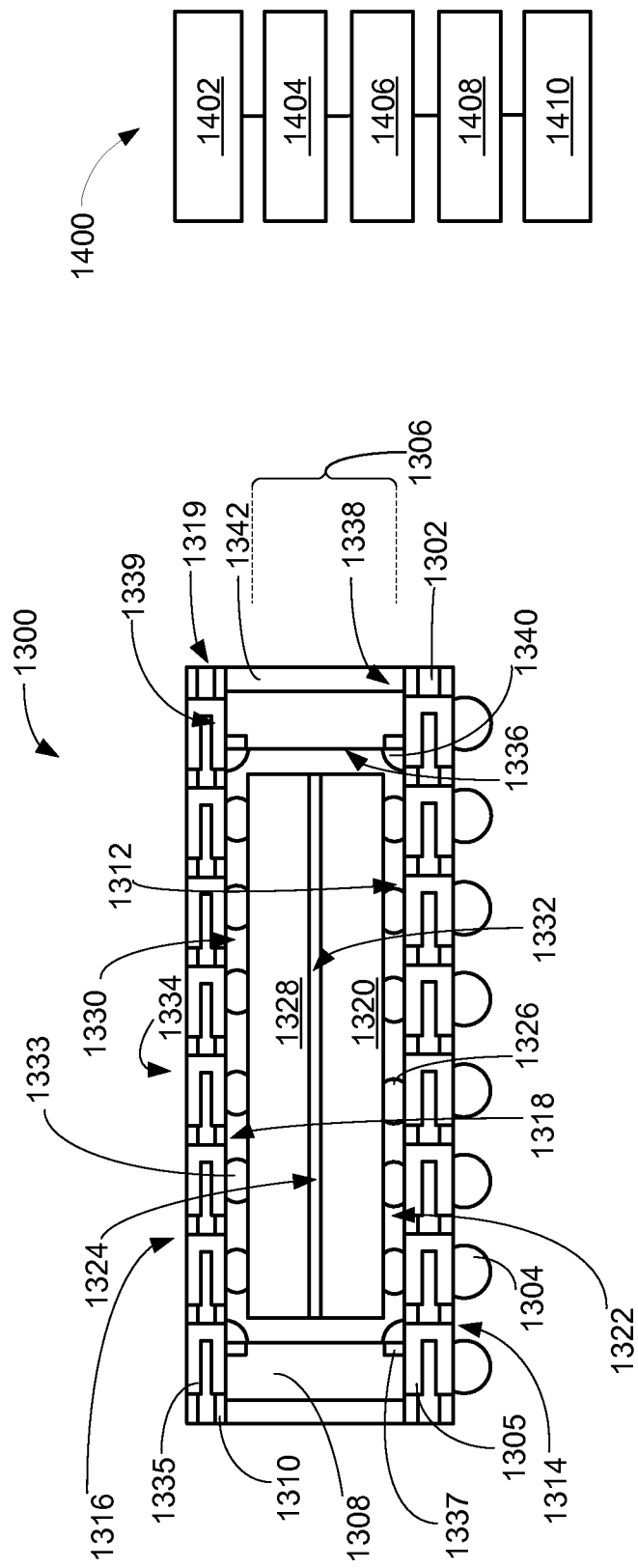

INTEGRATED CIRCUIT PACKAGING SYSTEM WITH CHIP STACKING AND METHOD OF MANUFACTURE THEREOF

TECHNICAL FIELD

The present invention relates generally to an integrated circuit packaging system, and more particularly to a chip stacking method.

BACKGROUND ART

The integrated circuit package is the building block used in a high performance electronic system to provide applications for usage in products such as automotive vehicles, pocket personal computers, cell phone, intelligent portable military devices, aeronautical spacecraft payloads, and a vast line of other similar products that require small compact electronics supporting many complex functions.

A small product, such as a cell phone, can contain many integrated circuit packages, each having different sizes and shapes. Each of the integrated circuit packages within the cell phone can contain large amounts of complex circuitry. The circuitry within each of the integrated circuit packages work and communicate with other circuitry of other integrated circuit packages using electrical connections.

Products must compete in world markets and attract many consumers or buyers in order to be successful. It is very important for products to continue to improve in features, performance, and reliability while reducing product costs, product size, and to be available quickly for purchase by the consumers or buyers.

The amount of circuitry and the amount of electrical connections inside a product are key to improving the features, performance, and reliability of any product. Furthermore, the ways the circuitry and electrical connections are implemented can determine the packaging size, packaging methods, and the individual packaging designs.

Attempts have failed to provide a complete solution addressing simplified manufacturing processing, smaller dimensions, lower costs due to design flexibility, increased functionality, leveragability, and increased IO connectivity capabilities.

Thus, a need still remains for an integrated circuit packaging system with improved yield, lower profiles, and improved reliability.

In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a first substrate; mounting an integrated circuit structure on the first substrate; mounting a second substrate on the integrated circuit structure; coupling a vertical chip to the first substrate and to the second substrate; and forming a package body for encapsulating the integrated circuit structure, the vertical chip, and a portion of the second substrate.

The present invention provides an integrated circuit packaging system including: a first substrate; an integrated circuit structure mounted on the first substrate; a second substrate mounted on the integrated circuit structure; a vertical chip coupled to the first substrate and to the second substrate; and a package body for encapsulating the integrated circuit structure, the vertical chip, and a portion of the second substrate.

Certain embodiments of the invention have other steps or elements in addition to or in place of those mentioned above. The steps or elements will become apparent to those skilled in the art from a reading of the following detailed description when taken with reference to the accompanying drawings.

BRIEF DESCRIPTION OF THE DRAWINGS

FIG. 13 is a cross-sectional view of an integrated circuit packaging system exemplified by the bottom view along line 1-1 of FIG. 2 in a sixth embodiment of the present invention.

FIG. 14 is a flow chart of a method of manufacture of the integrated circuit packaging system in a further embodiment of the present invention.

BEST MODE FOR CARRYING OUT THE INVENTION

Figure 1:
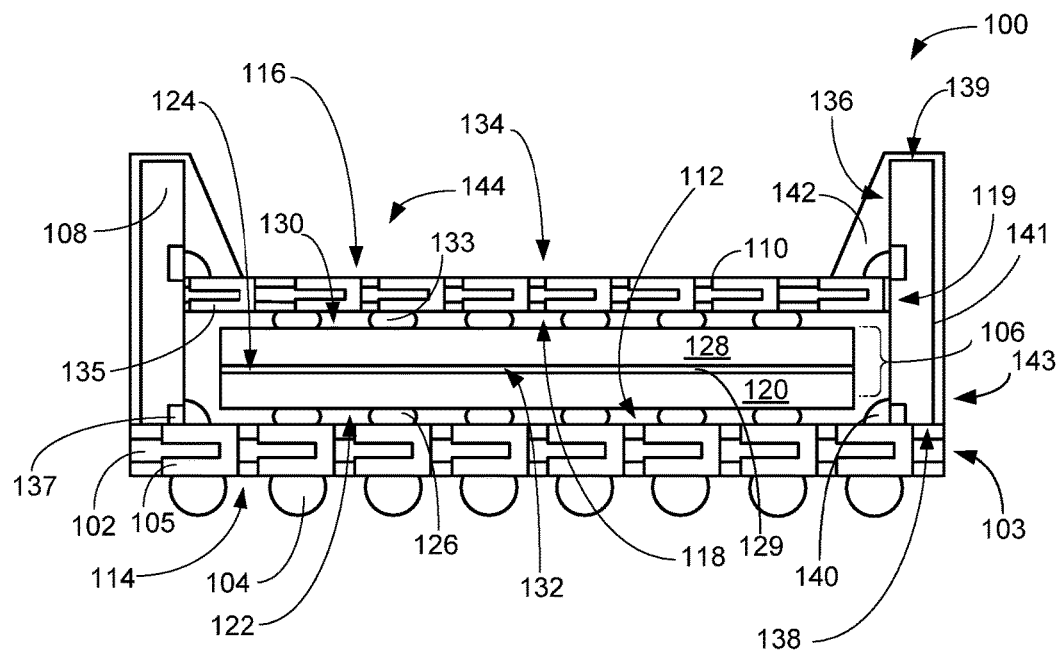
FIG. 1 is a cross-sectional view of an integrated circuit packaging system taken along a line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention.

However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of the system side of the substrate, regardless of its orientation. The term "vertical" refers to a direction perpendicular to the horizontal as just defined.

The term "non-horizontal" refers to any angle between horizontal including vertical as previously defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between an elements with no intervening elements in between.

The term "active side" refers to a side of a die, or an electronic structure having active circuitry fabricated thereon or having elements for connection to the active circuitry within the die, or the electronic structure. The term "processing" as used herein includes deposition of material or photoresist, patterning, exposure, development, etching, cleaning, and/or removal of the material or photoresist as required in forming a described structure.

Figure 2:
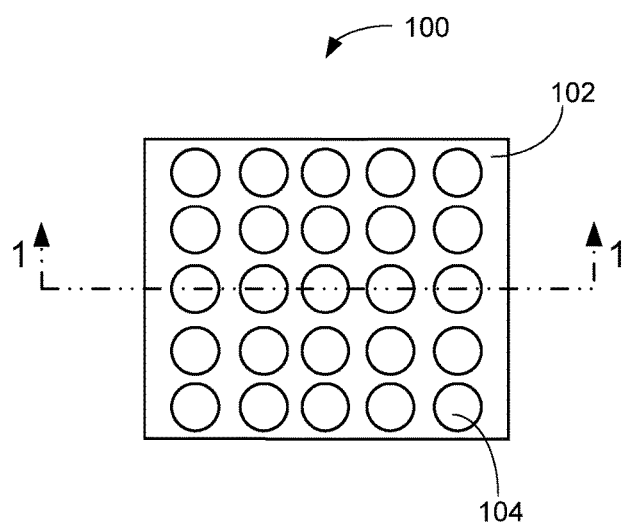
FIG. 2 is a bottom view of the integrated circuit packaging system.

Referring now to FIG. 1, therein is shown a cross-sectional view of an integrated circuit packaging system 100 taken along a line 1-1 of FIG. 2 in a first embodiment of the present invention. The integrated circuit packaging system 100 can include a first substrate 102, a system interconnect 104, an integrated circuit structure 106, a vertical chip 108, and a second substrate 110.

The first substrate 102 can provide support and connectivity for other components and devices. The first substrate 102 can include conductive layers and conductive traces embedded therein. The first substrate 102 can include a component side 112 for mounting components, devices, and packages. The first substrate 102 can also include a system side 114, which is a side opposite to the component side 112, for connecting to the next system level (not shown).

The system interconnect 104 is defined as an electrical connector providing direct electrical and mechanical connection to the next system level. The system interconnect 104 is attached to the system side 114 of the first substrate 102. As an example, the system interconnect 104 can be a solder ball, a solder pillar, a bond wire, or a conductive bump.

The first substrate 102 can include a substrate component contact 105, which is defined as a conductive structure embedded within the first substrate 102 and exposed from the first substrate 102 on the component side 112. The substrate component contact 105 can provide an electrical connection between the system interconnect 104 and components that are mounted over the first substrate 102.

The integrated circuit structure 106 is defined as a structure with at least one integrated circuit die and a device, component, package, or a combination thereof attached to the integrated circuit die. For example, the integrated circuit structure 106 can be two or more stacked integrated circuit dies, an integrated circuit die stacked with a heat sink, an integrated circuit die stacked with an integrated circuit package, or a combination thereof.

The integrated circuit structure 106 can include a base integrated circuit 120, which is defined as an integrated circuit die. The base integrated circuit 120 can include a flip chip die or a wire bonded die. The base integrated circuit 120 can have a base active side 122 with active circuitry fabricated thereon and a base inactive side 124 opposite to the base active side 122.

The integrated circuit structure 106 can include a first structure interconnect 126, which is defined as a conductive structure for providing an electrical connection. The first structure interconnect 126 can be used to attach the base integrated circuit 120 to the first substrate 102. As an example, the first structure interconnect 126 can be a solder ball, a solder pillars, a conductive bump, or a bond wire. The first structure interconnect 126 can be directly attached to the base active side 122 of the base integrated circuit 120 for attaching the base integrated circuit 120 to the substrate component contact 105 of the first substrate 102.

The integrated circuit structure 106 can include a stack device 128, which is defined as a component, an integrated circuit die, integrated circuit package, or a combination thereof for stacking over other dies, components, and packages. The stack device 128 can include a flip chip die, a wire bonded die, or an integrated circuit package. The stack device 128 can be mounted over the base integrated circuit 120.

The stack device 128 can have an interconnect side 130 and an attach side 132 opposite to the interconnect side 130. The interconnect side 130 can have interconnects, solder, or bond wires mounted thereon for connecting the stack device 128 to another substrate, package, or die. The attach side 132 can be attached to the base integrated circuit 120. The attach side 132 of the stack device 128 can be attached to the base inactive side 124 of the base integrated circuit 120 by an adhesive layer 129.

The stack device 128 can include a second structure interconnect 133 directly attached to the interconnect side 130 of the stack device 128. The second structure interconnect 133 is defined as a conductive structure for providing an electrical connection. The second structure interconnect 133 can be used to attach the stack device 128 to other components, substrates, devices, and packages. As an example, the second structure interconnect 133 can be a solder ball, a solder pillars, a conductive bump, or a bond wire.

The second substrate 110 can be mounted over the integrated circuit structure 106. The second substrate 110 can provide a similar function as the first substrate 102 and can include conductive layers and conductive traces embedded therein. The second substrate 110 can include a top side 116 facing opposite to the first substrate 102 and a bottom side 118 facing opposite to the top side 116.

The second substrate 110 is depicted as having a smaller mounting area then the first substrate 102 although the second substrate 110 can be any size depending on the configuration of the integrated circuit packaging system 100. For example, the second substrate 110 can have an equal or larger mounting area than the first substrate 102.

The second substrate 110 can include a substrate non-horizontal side 119, which is defined as a perimeter edge of the second substrate 110 perpendicular to the top side 116 and the bottom side 118. The first substrate 102 can include a first substrate non-horizontal side 103, which is a perimeter edge of the first substrate 102 perpendicular to the top side 116 and the bottom side 118. The second substrate 110 can include a non-periphery portion 134, which is defined as an interior portion of the top side 116 of the second substrate 110 not including an area along a perimeter of the top side 116. The non-periphery portion 134 can be used to mount interconnects, components, substrates, devices, or packages thereon.

The second substrate 110 can include a second substrate contact 135, which is defined as a contact pad embedded within the second substrate 110. The second substrate contact 135 can provide an electrical connection to the second substrate 110 from the top side 116 and the bottom side 118 of the second substrate 110.

The vertical chip 108 is defined as an integrated circuit die. The vertical chip 108 can be directly coupled to the first substrate 102 and adjacent to the integrated circuit structure 106. The vertical chip 108 can include a vertical chip active side 136, a vertical chip stacking side 138, and a vertical chip top side 139.

The vertical chip active side 136 is defined as the active side of the vertical chip 108 with active circuitry fabricated thereon. The vertical chip stacking side 138 is the side of the vertical chip 108 stacked on a substrate and perpendicular to the vertical chip active side 136. The vertical chip top side 139 is the side of the vertical chip 108 opposite to the vertical chip stacking side 138.

The vertical chip 108 can include a bond pad 137 for providing an electrical connection from other components to the vertical chip 108. The bond pad 137 can be embedded on the vertical chip active side 136 of the vertical chip 108.

The vertical chip stacking side 138 of the vertical chip 108 can be directly attached to the component side 112 of the first substrate 102. The vertical chip active side 136 of the vertical chip 108 can be electrically connected to the second substrate 110 by an arch interconnect 140.

The vertical chip 108 can include the arch interconnect 140, which is defined as a conductive structure for electrically coupling the vertical chip 108. The arch interconnect 140 can electrically couple the bond pad 137 to the substrate component contact 105 of the first substrate 102. The arch interconnect 140 can electrically couple the bond pad 137 to the second substrate contact 135 of the second substrate 110.

The vertical chip active side 136 can be directly attached to the substrate non-horizontal side 119 of the second substrate 110. A portion of the vertical chip 108 at an end towards the vertical chip top side 139 can extend over the second substrate 110.

The integrated circuit packaging system 100 can include a package body 142, which is defined as an encapsulation for hermetically sealing components from the environment. The package body 142 can include an epoxy molding compound (EMC), polymide compound, molded under-fill encapsulation, or a wire-in-film (WIF) encapsulation. The package body 142 can be formed on the first substrate 102 and the second substrate 110 and can encapsulate the integrated circuit structure 106, the vertical chip 108, the first structure interconnect 126, and the arch interconnect 140. The package body 142 is directly on a vertical chip outer side 141 of the vertical chip 108. The vertical chip outer side 141 faces away from the bond pad 137. The vertical chip outer side 141 is perpendicular to the vertical chip stacking side 138 that is directly on the component side 112 of the first substrate 102. The package body 142 can include a package body outer sidewall 143, which is an outer surface of the package body 142 perpendicular to the vertical chip top side 139. The package body outer sidewall 143 is formed coplanar to the first substrate non-horizontal side 103.

The package body 142 can include a cavity 144 exposing the non-periphery portion 134 of the second substrate 110 from the package body 142. A top surface of the package body 142 can be parallel to the top side 116 of the second substrate 110. The cavity 144 within the package body 142 can form a sidewall of the package body 142 with a non-vertical slope from the top surface of the package body 142 to the top side of the second substrate 110. Components, devices, packages, or a combination thereof can be mounted on the non-periphery portion 134 within the cavity 144.

It has been discovered that the vertical chip 108 attached to the first substrate 102 and the second substrate 110 can provide more integrated circuit dies available in a given package and more integrated circuit die available in a lower package profile. The vertical chip 108 can converge the functions of support bumps and pillars and vertical interconnects into one structure for more efficiency in space saving. The configuration of the vertical chip 108 on the first substrate 102 and attached to the substrate non-horizontal side 119 of the second substrate 110 also provides a lower package profile than four integrated circuits mounted on top of each other.

Further, it has been discovered that the vertical chip 108 and the arch interconnect 140 provide more efficient vertical interconnections between vertical levels in the integrated circuit packaging system 100 over vias and wire bonds. The vertical chip 108 can be directly mounted to the first substrate 102 and the second substrate 110 for improved input/output (I/O) performance. More contacts with a narrow pitch can be made between the vertical chip 108 and substrates because the vertical chip 108 eliminates the problem of wire sweep of bond wires.

Referring now to FIG. 2, therein is shown a bottom view of the integrated circuit packaging system 100. The integrated circuit packaging system 100 can include the first substrate 102 and the system interconnect 104.

For illustrative purposes, the system interconnect 104 is shown with a fully populated array although it is understood that the system interconnect 104 can be arranged in other array configurations. For example, the array for the system interconnect 104 can be a five by five array, an array with fewer number of the system interconnect 104, or an array with a larger number of the system interconnect 104.

Figure 3:
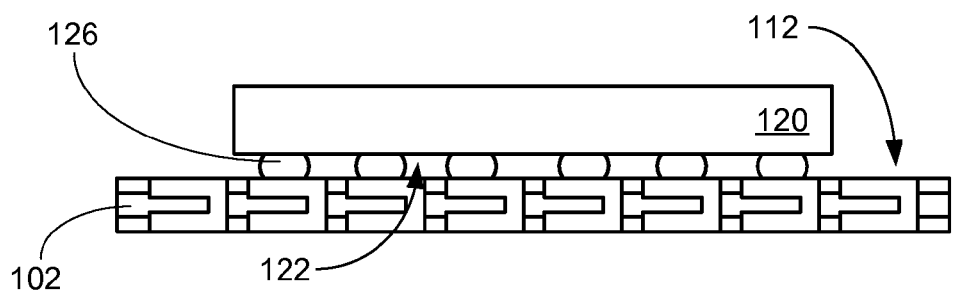
FIG. 3 is the cross-sectional view of an integrated circuit die attachment phase.

Referring now to FIG. 3, therein is shown the cross-sectional view of an integrated circuit die attachment phase. The phase depicts the first substrate 102, the base integrated circuit 120, and the first structure interconnect 126. The first structure interconnect 126 can be attached to the base active side 122 of the base integrated circuit 120 for mounting the base integrated circuit 120 to the first substrate 102. The base integrated circuit 120 can be mounted to the component side 112 of the first substrate 102.

It is understood that while only a single unit of the first substrate 102 is shown for clarity, in production a substrate sheet can be used to produce multiple units of the first substrate 102, concurrently. It is further understood that a singulation process would be used to separate the individual instances of the first substrate 102 after the structure process is completed.

Figure 4:
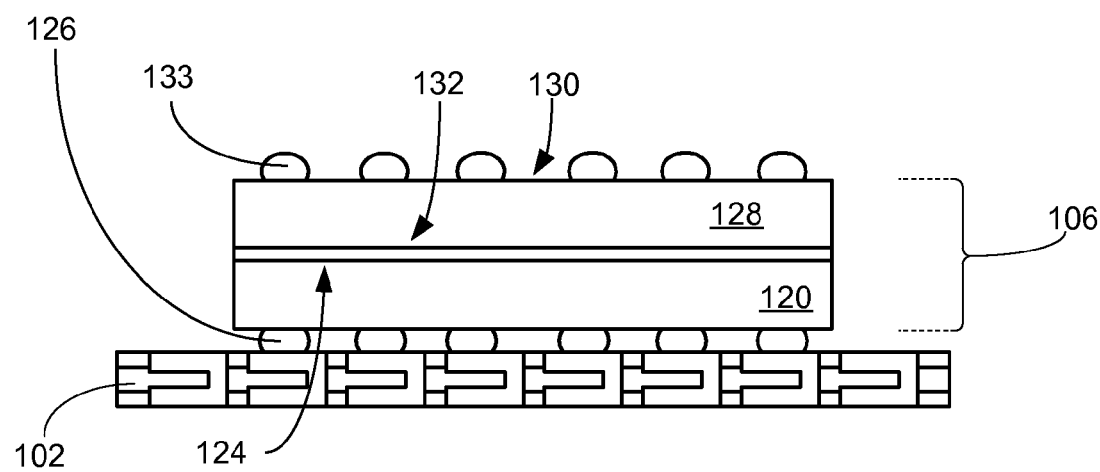
FIG. 4 is the structure of FIG. 3 in the integrated circuit structure mounting phase.

Referring now to FIG. 4, therein is shown the structure of FIG. 3 in the integrated circuit structure 106 mounting phase. The phase depicts the first substrate 102, the base integrated circuit 120, the first structure interconnect 126, the second structure interconnect 133, and the stack device 128.

The attach side 132 of the stack device 128 can be mounted on the base inactive side 124 of the base integrated circuit 120 by an adhesive layer. The second structure interconnect 133 can also be attached to the interconnect side 130 of the stack device 128. The base integrated circuit 120 attached to the stack device 128 form the integrated circuit structure 106.

Figure 5:
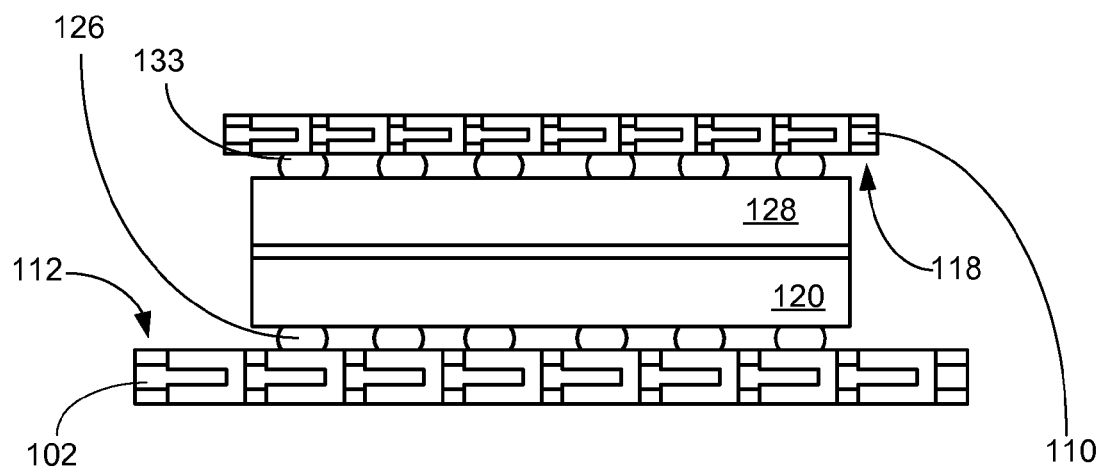
FIG. 5 is the structure of FIG. 4 in the second substrate mounting phase.

Referring now to FIG. 5, therein is shown the structure of FIG. 4 in the second substrate 110 mounting phase. The phase depicts the first substrate 102, the base integrated circuit 120, the first structure interconnect 126, the second structure interconnect 133, the stack device 128, and the second substrate 110. The second substrate 110 can be mounted on the first structure interconnect 126 of the stack device 128. The bottom side 118 of the second substrate 110 can face the component side 112 of the first substrate 102.

Figure 6:
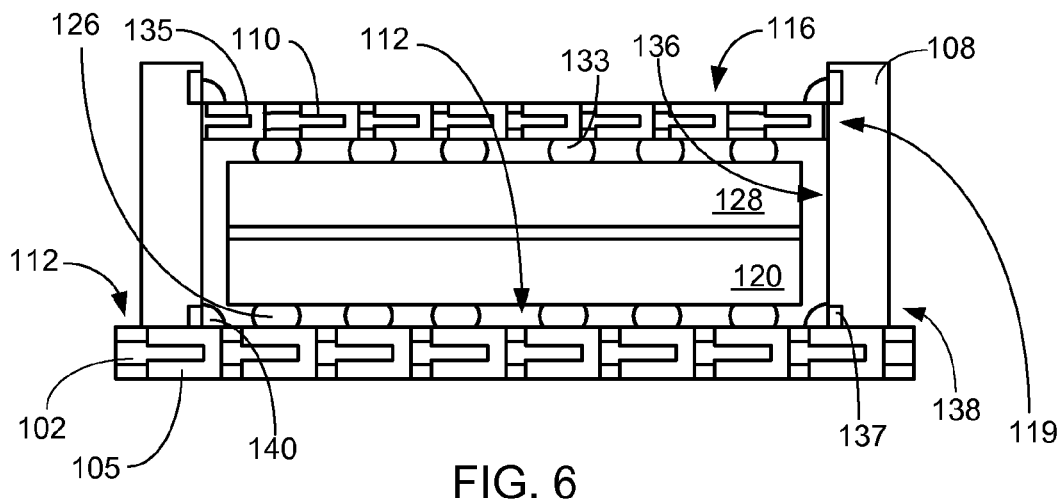
FIG. 6 is the structure of FIG. 5 in the vertical chip attachment phase.

Referring now to FIG. 6, therein is shown the structure of FIG. 5 in the vertical chip 108 attachment phase. The phase depicts the first substrate 102, the base integrated circuit 120, the first structure interconnect 126, the second structure interconnect 133, the stack device 128, the second substrate 110, the vertical chip 108, the second substrate contact 135, the bond pad 137, and the arch interconnect 140.

The vertical chip stacking side 138 of the vertical chip 108 can be directly attached to the component side 112 of the first substrate 102. The arch interconnect 140 can electrically couple the bond pad 137 to the second substrate contact 135 of the second substrate 110. The vertical chip active side 136 of the vertical chip 108 can be directly attached to the substrate non-horizontal side 119 of the second substrate 110. The arch interconnect 140 can electrically couple the bond pad 137 to the top side 116 of the second substrate 110.

The arch interconnect 140 can be formed by attaching a plated conductive material to the vertical chip 108. The arch interconnect 140 can be conductive metal or alloy for providing an electrical pathway. For example, the conductive substance of the conductive material can include solder, aluminum, copper, or other conductive materials. The conductive material is reflowed and the conductive material forms a super hemispheric bump that arches from the bond pad 137 on the vertical chip 108 to the substrate component contact 105 on the first substrate 102. The same process can be used to form the arch interconnect 140 coupling the bond pad 137 to the second substrate contact 135 of the second substrate 110.

Figure 7:
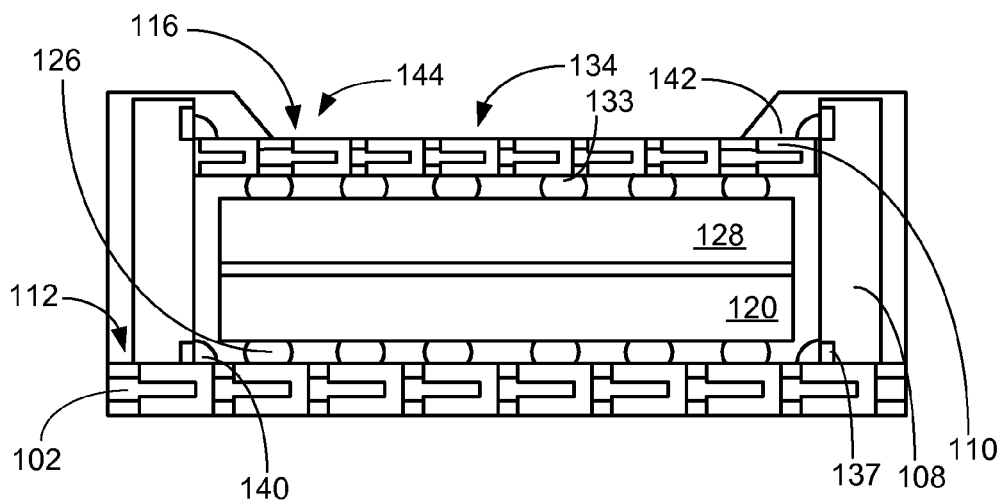
FIG. 7 is the structure of FIG. 6 in the package body formation phase.

Referring now to FIG. 7, therein is shown the structure of FIG. 6 in the package body 142 formation phase. The phase depicts the first substrate 102, the base integrated circuit 120, the first structure interconnect 126, the second structure interconnect 133, the stack device 128, the second substrate 110, the vertical chip 108, the bond pad 137, the arch interconnect 140, the package body 142, and the cavity 144.

The package body 142 can include an epoxy molding compound (EMC), polyimide compound, molded under-fill or a wire-in-film (WIF) encapsulation. The package body 142 can be formed on the first substrate 102 and the second substrate 110 and can encapsulate the base integrated circuit 120, the stack device 128, the first structure interconnect 126, the vertical chip 108, the arch interconnect 140, and the component side 112. The package body 142 can be formed on the first substrate 102 and the second substrate 110 and can encapsulate the base integrated circuit 120, the stack device 128, the first structure interconnect 126, and the vertical chip 108.

The package body 142 can include the cavity 144 exposing the non-periphery portion 134 of the second substrate 110 from the package body 142. A top surface of the package body 142 can be parallel to the top side 116 of the second substrate 110. The cavity 144 within the package body 142 can form a sidewall of the package body 142 with a non-vertical slope from the top surface of the package body 142 to the top side of the second substrate 110. Components, devices, packages, or a combination thereof can be mounted on the non-periphery portion 134 within the cavity 144.

Figure 8:
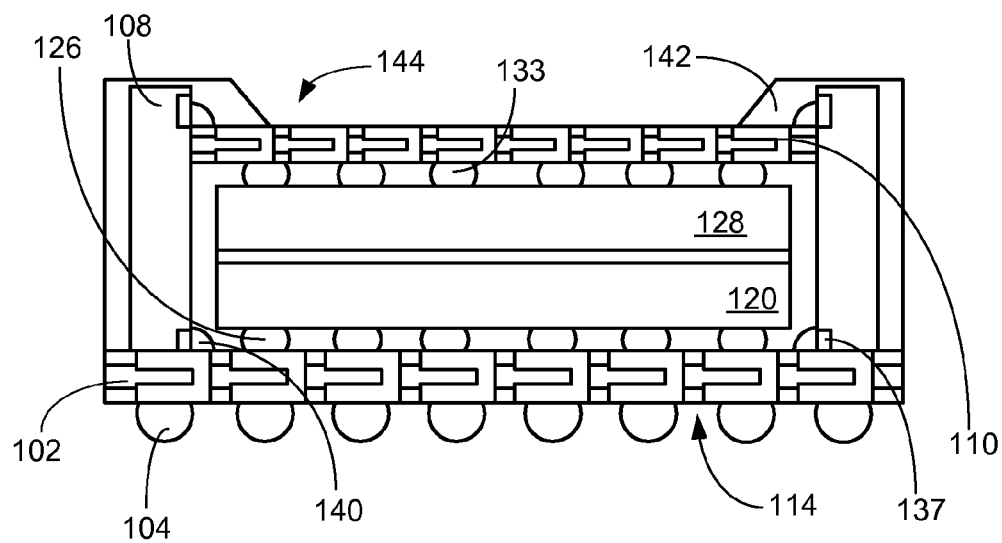
FIG. 8 is the structure of FIG. 7 in the system interconnect attachment phase.

Referring now to FIG. 8, therein is shown the structure of FIG. 7 in the system interconnect 104 attachment phase. The phase depicts the first substrate 102, the base integrated circuit 120, the first structure interconnect 126, the second structure interconnect 133, the stack device 128, the second substrate 110, the vertical chip 108, the bond pad 137, the arch interconnect 140, the package body 142, the cavity 144, and the system interconnect 104. The system interconnect 104 can be directly attached to the system side 114 of the first substrate 102.

Figure 9:
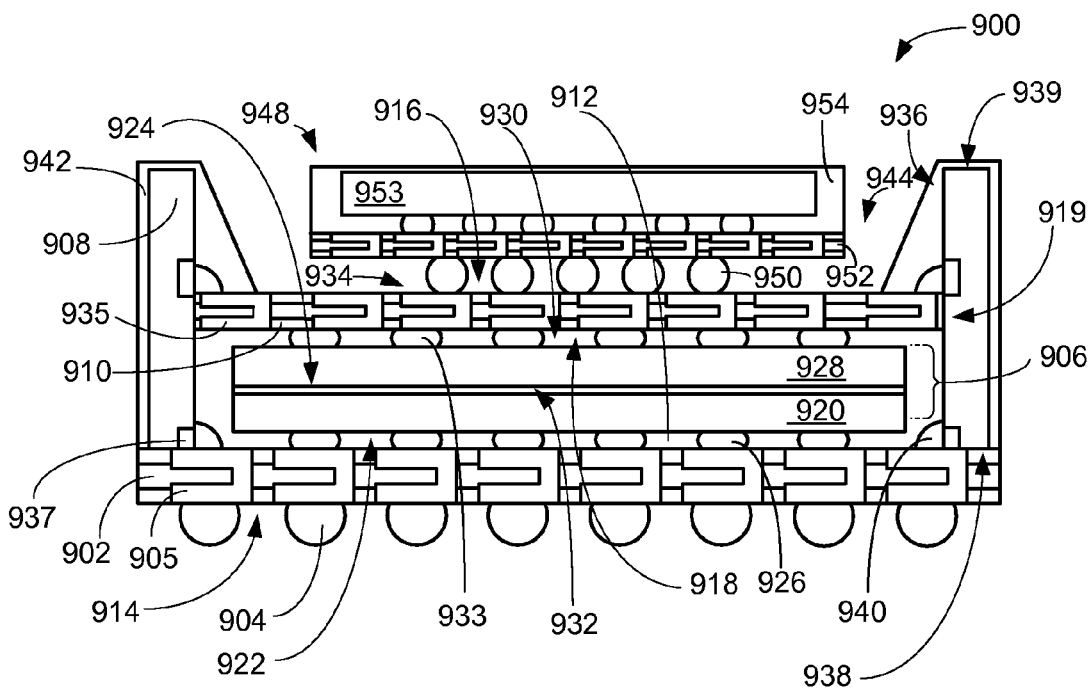
FIG. 9 is a cross-sectional view of an integrated circuit packaging system exemplified by the bottom view along line 1-1 of FIG. 2 in a second embodiment of the present invention.

Referring now to FIG. 9, therein is shown a cross-sectional view of an integrated circuit packaging system 900 exemplified by the bottom view along line 1-1 of FIG. 2 in a second embodiment of the present invention. The integrated circuit packaging system 900 can be similar to the integrated circuit packaging system 900 of FIG. 1 except the integrated circuit packaging system 900 includes a top integrated circuit package.

The integrated circuit packaging system 900 can include a first substrate 902, a system interconnect 904, an integrated circuit structure 906, a vertical chip 908, and a second substrate 910.

The first substrate 902 can provide support and connectivity for other components and devices. The first substrate 902 can include conductive layers and conductive traces embedded therein. The first substrate 902 can include a component side 912 for mounting components, devices, and packages. The first substrate 902 can also include a system side 914, which is a side opposite to the component side 912, for connecting to the next system level (not shown).

The system interconnect 904 is defined as an electrical connector providing direct electrical and mechanical connection to the next system level. The system interconnect 904 is attached to the system side 914 of the first substrate 902. As an example, the system interconnect 904 can be a solder ball, a solder pillar, a bond wire, or a conductive bump.

The first substrate 902 can include a substrate component contact 905, which is defined as a conductive structure embedded within the first substrate 902 and exposed from the first substrate 902 on the component side 912. The substrate component contact 905 can provide an electrical connection between the system interconnect 904 and components that are mounted over the first substrate 902.

The integrated circuit structure 906 is defined as a structure with at least one integrated circuit die and a device, component, package, or a combination thereof attached to the integrated circuit die. For example, the integrated circuit structure 906 can be two or more stacked integrated circuit dies, an integrated circuit die stacked with a heat sink, an integrated circuit die stacked with an integrated circuit package, or a combination thereof.

The integrated circuit structure 906 can include a base integrated circuit 920, which is defined as an integrated circuit die. The base integrated circuit 920 can include a flip chip die or a wire bonded die. The base integrated circuit 920 can have a base active side 922 with active circuitry fabricated thereon and a base inactive side 924 opposite to the base active side 922.

The integrated circuit structure 906 can include a first structure interconnect 926, which is defined as a conductive structure for providing an electrical connection. The first structure interconnect 926 can be used to attach the base integrated circuit 920 to the first substrate 902. As an example, the first structure interconnect 926 can be a solder ball, a solder pillars, a conductive bump, or a bond wire. The first structure interconnect 926 can be directly attached to the base active side 922 of the base integrated circuit 920 for attaching the base integrated circuit 920 to the substrate component contact 905 of the first substrate 902.

The integrated circuit structure 906 can include a stack device 928, which is defined as a component, an integrated circuit die, integrated circuit package, or a combination thereof for stacking over other dies, components, and packages. The stack device 928 can include a flip chip die, a wire bonded die, or an integrated circuit package. The stack device 928 can be mounted over the base integrated circuit 920.

The stack device 928 can have an interconnect side 930 and an attach side 932 opposite to the interconnect side 930. The interconnect side 930 can have interconnects, solder, or bond wires mounted thereon for connecting the stack device 928 to another substrate, package, or die. The attach side 932 can be attached to the base integrated circuit 920. The attach side 932 of the stack device 928 can be attached to the base inactive side 924 of the base integrated circuit 920 by an adhesive layer.

The stack device 928 can include a second structure interconnect 933 directly attached to the interconnect side 930 of the stack device 928. The second structure interconnect 933 is defined as a conductive structure for providing an electrical connection. The second structure interconnect 933 can be used to attach the stack device 928 to other components, substrates, devices, and packages. As an example, the second structure interconnect 933 can be a solder ball, a solder pillars, a conductive bump, or a bond wire.

The second substrate 910 can be mounted over the integrated circuit structure 906. The second substrate 910 can provide a similar function as the first substrate 902 and can include conductive layers and conductive traces embedded therein. The second substrate 910 can include a top side 916 facing opposite to the first substrate 902 and a bottom side 918 facing opposite to the top side 916.

The second substrate 910 is depicted as having a smaller mounting area then the first substrate 902 although the second substrate 910 can be any size depending on the configuration of the integrated circuit packaging system 900. For example, the second substrate 910 can have an equal or larger mounting area than the first substrate 902.

The second substrate 910 can include a substrate non-horizontal side 919, which is defined as a perimeter edge of the second substrate 910 perpendicular to the top side 916 and the bottom side 918. The second substrate 910 can include a non-periphery portion 934, which is defined as an interior portion of the top side 916 of the second substrate 910 not including an area along a perimeter of the top side 916. The non-periphery portion 934 can be used to mount interconnects, components, substrates, devices, or packages thereon.

The second substrate 910 can include a second substrate contact 935, which is defined as a contact pad embedded within the second substrate 910. The second substrate contact 935 can provide an electrical connection to the second substrate 910 from the top side 916 and the bottom side 918 of the second substrate 910.

The vertical chip 908 is defined as an integrated circuit die. The vertical chip 908 can be directly coupled to the first substrate 902 and adjacent to the integrated circuit structure 906. The vertical chip 908 can include a vertical chip active side 936, a vertical chip stacking side 938, and a vertical chip top side 939.

The vertical chip active side 936 is defined as the active side of the vertical chip 908 with active circuitry fabricated thereon. The vertical chip stacking side 938 is the side of the vertical chip 908 stacked on a substrate and perpendicular to the vertical chip active side 936. The vertical chip top side 939 is the side of the vertical chip 908 opposite to the vertical chip stacking side 938.

The vertical chip 908 can include a bond pad 937 for providing an electrical connection from other components to the vertical chip 908. The bond pad 937 can be embedded on the vertical chip active side 936 of the vertical chip 908.

The vertical chip stacking side 938 of the vertical chip 908 can be directly attached to the component side 912 of the first substrate 902. The vertical chip active side 936 of the vertical chip 908 can be electrically connected to the second substrate 910 by an arch interconnect 940.

The vertical chip 908 can include the arch interconnect 940, which is defined as a conductive structure for electrically coupling the vertical chip 908. The arch interconnect 940 can electrically couple the bond pad 937 to the substrate component contact 905 of the first substrate 902. The arch interconnect 940 can electrically couple the bond pad 937 to the second substrate contact 935 of the second substrate 910.

The vertical chip active side 936 can be directly attached to the substrate non-horizontal side 919 of the second substrate 910. A portion of the vertical chip 908 at an end towards the vertical chip top side 939 can extend over the second substrate 910.

The integrated circuit packaging system 900 can include a package body 942, which is defined as an encapsulation for hermetically sealing components from the environment. The package body 942 can include an epoxy molding compound (EMC), polymide compound, molded under-fill encapsulation, or a wire-in-film (WIF) encapsulation. The package body 942 can be formed on the first substrate 902 and the second substrate 910 and can encapsulate the integrated circuit structure 906, the vertical chip 908, the first structure interconnect 926, and the arch interconnect 940.

The package body 942 can include a cavity 944 exposing the non-periphery portion 934 of the second substrate 910 from the package body 942. A top surface of the package body 942 can be parallel to the top side 916 of the second substrate 910. The cavity 944 within the package body 942 can form a sidewall of the package body 942 with a non-vertical slope from the top surface of the package body 942 to the top side of the second substrate 910. Components, devices, packages, or a combination thereof can be mounted on the non-periphery portion 934 within the cavity 944.

The integrated circuit package system 900 can include a top integrated circuit package 948. The top integrated circuit package 948 can include a package interconnect 950, which is defined as a conductive structure for electrically coupling a package to another package. The package interconnect 950 can be solder balls, solder dots, solder bumps, wire bonds, or other conductive structures.

The package interconnect 950 can be attached to the non-periphery portion 934 of the second substrate 910. The package interconnect 950 can be electrically coupled to the second substrate contact 935 of the second substrate 910.

The top integrated circuit package 948 can include a top substrate 952, a top integrated circuit die 953, and a top encapsulation 954. The top integrated circuit package 948 can be mounted within the cavity 944 of the package body 942 with no parts of the top integrated circuit package 948 extending above a top surface of the package body 942.

The top substrate 952 is mounted on the package interconnect 950. The top substrate 952 can include conductive layers and conductive traces embedded therein. The top integrated circuit die 953 can be mounted on the top substrate 952. For illustrative purposes, the top integrated circuit die 953 can be a wire bonded chip although the top integrated circuit die 953 can also be a flip chip.

The top encapsulation 954 provides a cover for the top integrated circuit package 948 for hermetically sealing components from the environment. The top encapsulation 954 can encapsulate the top integrated circuit die 953 on the top substrate 952. The top encapsulation 954 can include an epoxy molding compound (EMC), polymide compound, a molded under-fill encapsulation, or a wire-in-film (WIF) encapsulation.

It has been discovered that the vertical chip 908 attached to the first substrate 902 and the second substrate 910 can provide more integrated circuit dies available in a given package and more integrated circuit die available in a lower package profile. The vertical chip 908 can converge the functions of support bumps and pillars and vertical interconnects into one structure for more efficiency in space saving. The configuration of the vertical chip 908 on the first substrate 902 and attached to the substrate non-horizontal side 919 of the second substrate 910 also provides a lower package profile than four integrated circuits mounted on top of each other.

Further, it has been discovered that the vertical chip 908 and the arch interconnect 940 provide more efficient vertical interconnections between vertical levels in the integrated circuit packaging system 900 over vias and wire bonds. The vertical chip 908 can be directly mounted to the first substrate 902 and the second substrate 910 for improved input/output (I/O) performance. More contacts with a narrow pitch can be made between the vertical chip 908 and substrates because the vertical chip 908 eliminates the problem of wire sweep of bond wires.

Figure 10:
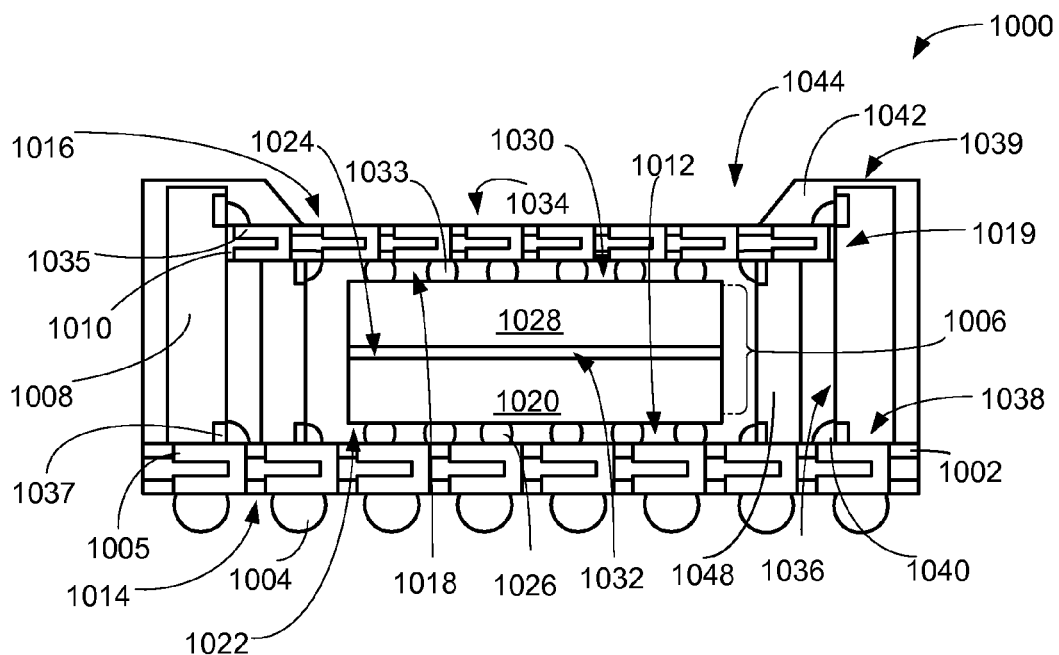
FIG. 10 is a cross-sectional view of an integrated circuit packaging system exemplified by the bottom view along line 1-1 of FIG. 2 in a third embodiment of the present invention.

Referring now to FIG. 10, therein is shown a cross-sectional view of an integrated circuit packaging system 1000 exemplified by the bottom view along line 1-1 of FIG. 2 in a third embodiment of the present invention. The integrated circuit packaging system 1000 can be similar to the integrated circuit packaging system 100 of FIG. 1 except the integrated circuit packaging system 1000 can include a second vertical chip 1048.

The integrated circuit packaging system 1000 can include a first substrate 1002, a system interconnect 1004, an integrated circuit structure 1006, a vertical chip 1008, and a second substrate 1010.

The first substrate 1002 can provide support and connectivity for other components and devices. The first substrate 1002 can include conductive layers and conductive traces embedded therein. The first substrate 1002 can include a component side 1012 for mounting components, devices, and packages. The first substrate 1002 can also include a system side 1014, which is a side opposite to the component side 1012, for connecting to the next system level (not shown).

The system interconnect 1004 is defined as an electrical connector providing direct electrical and mechanical connection to the next system level. The system interconnect 1004 is attached to the system side 1014 of the first substrate 1002. As an example, the system interconnect 1004 can be a solder ball, a solder pillar, a bond wire, or a conductive bump.

The first substrate 1002 can include a substrate component contact 1005, which is defined as a conductive structure embedded within the first substrate 1002 and exposed from the first substrate 1002 on the component side 1012. The substrate component contact 1005 can provide an electrical connection between the system interconnect 1004 and components that are mounted over the first substrate 1002.

The integrated circuit structure 1006 is defined as a structure with at least one integrated circuit die and a device, component, package, or a combination thereof attached to the integrated circuit die. For example, the integrated circuit structure 1006 can be two or more stacked integrated circuit dies, an integrated circuit die stacked with a heat sink, an integrated circuit die stacked with an integrated circuit package, or a combination thereof.

The integrated circuit structure 1006 can include a base integrated circuit 1020, which is defined as an integrated circuit die. The base integrated circuit 1020 can include a flip chip die or a wire bonded die. The base integrated circuit 1020 can have a base active side 1022 with active circuitry fabricated thereon and a base inactive side 1024 opposite to the base active side 1022.

The integrated circuit structure 1006 can include a first structure interconnect 1026, which is defined as a conductive structure for providing an electrical connection. The first structure interconnect 1026 can be used to attach the base integrated circuit 1020 to the first substrate 1002. As an example, the first structure interconnect 1026 can be a solder ball, a solder pillars, a conductive bump, or a bond wire. The first structure interconnect 1026 can be directly attached to the base active side 1022 of the base integrated circuit 1020 for attaching the base integrated circuit 1020 to the substrate component contact 1005 of the first substrate 1002.

The integrated circuit structure 1006 can include a stack device 1028, which is defined as a component, an integrated circuit die, integrated circuit package, or a combination thereof for stacking over other dies, components, and packages. The stack device 1028 can include a flip chip die, a wire bonded die, or an integrated circuit package. The stack device 1028 can be mounted over the base integrated circuit 1020.

The stack device 1028 can have an interconnect side 1030 and an attach side 1032 opposite to the interconnect side 1030. The interconnect side 1030 can have interconnects, solder, or bond wires mounted thereon for connecting the stack device 1028 to another substrate, package, or die. The attach side 1032 can be attached to the base integrated circuit 1020. The attach side 1032 of the stack device 1028 can be attached to the base inactive side 1024 of the base integrated circuit 1020 by an adhesive layer.

The stack device 1028 can include a second structure interconnect 1033 directly attached to the interconnect side 1030 of the stack device 1028. The second structure interconnect 1033 is defined as a conductive structure for providing an electrical connection. The second structure interconnect 1033 can be used to attach the stack device 1028 to other components, substrates, devices, and packages. As an example, the second structure interconnect 1033 can be a solder ball, a solder pillars, a conductive bump, or a bond wire.

The second substrate 1010 can be mounted over the integrated circuit structure 1006. The second substrate 1010 can provide a similar function as the first substrate 1002 and can include conductive layers and conductive traces embedded therein. The second substrate 1010 can include a top side 1016 facing opposite to the first substrate 1002 and a bottom side 1018 facing opposite to the top side 1016.

The second substrate 1010 is depicted as having a smaller mounting area then the first substrate 1002 although the second substrate 1010 can be any size depending on the configuration of the integrated circuit packaging system 1000. For example, the second substrate 1010 can have an equal or larger mounting area than the first substrate 1002.

The second substrate 1010 can include a substrate non-horizontal side 1019, which is defined as a perimeter edge of the second substrate 1010 perpendicular to the top side 1016 and the bottom side 1018. The second substrate 1010 can include a non-periphery portion 1034, which is defined as an interior portion of the top side 1016 of the second substrate 1010 not including an area along a perimeter of the top side 1016. The non-periphery portion 1034 can be used to mount interconnects, components, substrates, devices, or packages thereon.

The second substrate 1010 can include a second substrate contact 1035, which is defined as a contact pad embedded within the second substrate 1010. The second substrate contact 1035 can provide an electrical connection to the second substrate 1010 from the top side 1016 and the bottom side 1018 of the second substrate 1010.

The vertical chip 1008 is defined as an integrated circuit die. The vertical chip 1008 can be directly coupled to the first substrate 1002 and adjacent to the integrated circuit structure 1006. The vertical chip 1008 can include a vertical chip active side 1036, a vertical chip stacking side 1038, and a vertical chip top side 1039.

The vertical chip active side 1036 is defined as the active side of the vertical chip 1008 with active circuitry fabricated thereon. The vertical chip stacking side 1038 is the side of the vertical chip 1008 stacked on a substrate and perpendicular to the vertical chip active side 1036. The vertical chip top side 1039 is the side of the vertical chip 1008 opposite to the vertical chip stacking side 1038.

The vertical chip 1008 can include a bond pad 1037 for providing an electrical connection from other components to the vertical chip 1008. The bond pad 1037 can be embedded on the vertical chip active side 1036 of the vertical chip 1008.

The vertical chip stacking side 1038 of the vertical chip 1008 can be directly attached to the component side 1012 of the first substrate 1002. The vertical chip active side 1036 of the vertical chip 1008 can be electrically connected to the second substrate 1010 by an arch interconnect 1040.

The vertical chip 1008 can include the arch interconnect 1040, which is defined as a conductive structure for electrically coupling the vertical chip 1008. The arch interconnect 1040 can electrically couple the bond pad 1037 to the substrate component contact 1005 of the first substrate 1002. The arch interconnect 1040 can electrically couple the bond pad 1037 to the second substrate contact 1035 of the second substrate 1010.

The vertical chip active side 1036 can be directly attached to the substrate non-horizontal side 1019 of the second substrate 1010. A portion of the vertical chip 1008 at an end towards the vertical chip top side 1039 can extend over the second substrate 1010.

The second vertical chip 1048 is defined as an integrated circuit die. The second vertical chip 1048 can be similar to the vertical chip 1008 except the second vertical chip 1048 extends from the first substrate 1002 to the bottom side 1018 of the second substrate 110 and does not extend beyond the bottom side 1018. The second vertical chip 1048 can be electrically coupled to the substrate component contact 1005 and the second substrate contact 135 on the bottom side 1018.

The integrated circuit packaging system 1000 can include a package body 1042, which is defined as an encapsulation for hermetically sealing components from the environment. The package body 1042 can include an epoxy molding compound (EMC), polymide compound, molded under-fill encapsulation, or a wire-in-film (WIF) encapsulation. The package body 1042 can be formed on the first substrate 1002 and the second substrate 1010 and can encapsulate the integrated circuit structure 1006, the vertical chip 1008, the first structure interconnect 1026, and the arch interconnect 1040.

The package body 1042 can include a cavity 1044 exposing the non-periphery portion 1034 of the second substrate 1010 from the package body 1042. A top surface of the package body 1042 can be parallel to the top side 1016 of the second substrate 1010. The cavity 1044 within the package body 1042 can form a sidewall of the package body 1042 with a non-vertical slope from the top surface of the package body 1042 to the top side of the second substrate 1010. Components, devices, packages, or a combination thereof can be mounted on the non-periphery portion 1034 within the cavity 1044. The second vertical chip 1048 can be positioned on the opposite side of the integrated circuit structure 1006 with the cavity 1044 between the vertical chip 1008 and the second vertical chip 1048. The second vertical chip 1048 is on the component side and attached to the second substrate 1010.

It has been discovered that the vertical chip 1008 attached to the first substrate 1002 and the second substrate 1010 can provide more integrated circuit dies available in a given package and more integrated circuit die available in a lower package profile. The vertical chip 1008 can converge the functions of support bumps and pillars and vertical interconnects into one structure for more efficiency in space saving. The configuration of the vertical chip 1008 on the first substrate 1002 and attached to the substrate non-horizontal side 1019 of the second substrate 1010 also provides a lower package profile than four integrated circuits mounted on top of each other.

Further, it has been discovered that the vertical chip 1008 and the arch interconnect 1040 provide more efficient vertical interconnections between vertical levels in the integrated circuit packaging system 1000 over vias and wire bonds. The vertical chip 1008 can be directly mounted to the first substrate 1002 and the second substrate 1010 for improved input/output (I/O) performance. More contacts with a narrow pitch can be made between the vertical chip 1008 and substrates because the vertical chip 1008 eliminates the problem of wire sweep of bond wires.

Figure 11:
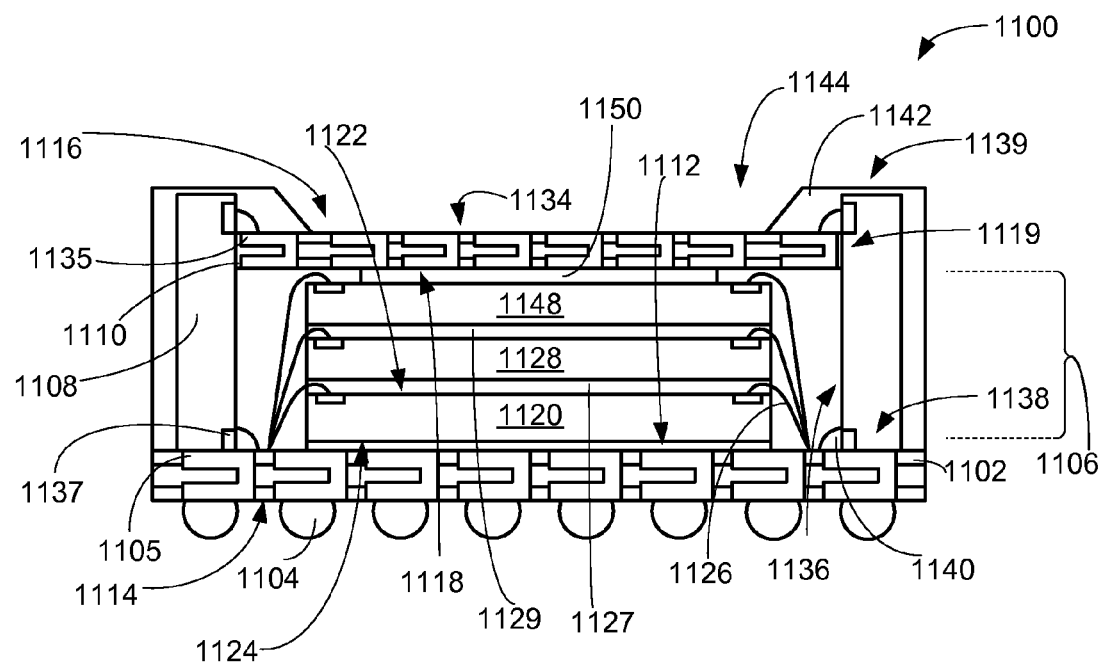
FIG. 11 is a cross-sectional view of an integrated circuit packaging system exemplified by the bottom view along line 1-1 of FIG. 2 in a fourth embodiment of the present invention.

Referring now to FIG. 11, therein is shown a cross-sectional view of an integrated circuit packaging system 1100 exemplified by the bottom view along line 1-1 of FIG. 2 in a fourth embodiment of the present invention. The integrated circuit packaging system 1100 can be similar to the integrated circuit packaging system 100 of FIG. 1 except the integrated circuit packaging system 1100 includes a second stack device 1148.

The integrated circuit packaging system 1100 can include a first substrate 1102, a system interconnect 1104, an integrated circuit structure 1106, a vertical chip 1108, and a second substrate 1110.

The first substrate 1102 can provide support and connectivity for other components and devices. The first substrate 1102 can include conductive layers and conductive traces embedded therein. The first substrate 1102 can include a component side 1112 for mounting components, devices, and packages. The first substrate 1102 can also include a system side 1114, which is a side opposite to the component side 1112, for connecting to the next system level (not shown).

The system interconnect 1104 is defined as an electrical connector providing direct electrical and mechanical connection to the next system level. The system interconnect 1104 is attached to the system side 1114 of the first substrate 1102. As an example, the system interconnect 1104 can be a solder ball, a solder pillar, a bond wire, or a conductive bump.

The first substrate 1102 can include a substrate component contact 1105, which is defined as a conductive structure embedded within the first substrate 1102 and exposed from the first substrate 1102 on the component side 1112. The substrate component contact 1105 can provide an electrical connection between the system interconnect 1104 and components that are mounted over the first substrate 1102.

The integrated circuit structure 1106 is defined as a structure with at least one integrated circuit die and a device, component, package, or a combination thereof attached to the integrated circuit die. For example, the integrated circuit structure 1106 can be two or more stacked integrated circuit dies, an integrated circuit die stacked with a heat sink, an integrated circuit die stacked with an integrated circuit package, or a combination thereof. The integrated circuit structure 1106 can include a base integrated circuit 1120, a stack device 1128, and a second stack device 1148.

The integrated circuit structure 1106 can include the base integrated circuit 1120, which is defined as an integrated circuit die. The base integrated circuit 1120 can include a flip chip die or a wire bonded die. The base integrated circuit 1120 can have a base active side 1122 with active circuitry fabricated thereon and a base inactive side 1124 opposite to the base active side 1122.

The integrated circuit structure 1106 can include a first structure interconnect 1126, which is defined as a conductive structure for providing an electrical connection. The first structure interconnect 1126 can be used to electrical couple the base integrated circuit 1120 to the first substrate 1102. As an example, the first structure interconnect 1126 can be a solder ball, a solder pillars, a conductive bump, or a bond wire. The first structure interconnect 1126 can be directly attached to the base active side 1122 of the base integrated circuit 1120 for electrically coupling the base integrated circuit 1120 to the substrate component contact 1105 of the first substrate 1102.

The base integrated circuit 1120 can include a first encapsulation 1127, which is defined as an encapsulation for hermetically sealing components from the environment. The first encapsulation 1127 can include an epoxy molding compound (EMC), polymide compound, molded under-fill encapsulation, or a wire-in-film (WIF) encapsulation.

The first encapsulation 1127 can encapsulate a portion of the first structure interconnect 1126 on the base active side 1122 of the base integrated circuit 1120. The first encapsulation 1127 can provide spacing and a mounting platform for other dies, packages, and components.

The integrated circuit structure 1106 can include the stack device 1128, which is defined as a component, an integrated circuit die, integrated circuit package, or a combination thereof for stacking over other dies, components, and packages. The stack device 1128 can include a flip chip die, a wire bonded die, or an integrated circuit package. The stack device 1128 can be mounted over the base integrated circuit 1120.

The stack device 1128 can include a second encapsulation 1129, which is defined as an encapsulation for hermetically sealing components from the environment. The second encapsulation 1129 can include an epoxy molding compound (EMC), polymide compound, molded under-fill encapsulation, or a wire-in-film (WIF) encapsulation.

The second encapsulation 1129 can encapsulate interconnects such as bond wires that electrically couple the stack device 1128 to other components. The second encapsulation 1129 can provide spacing and a mounting platform for other dies, packages, and components.

The second stack device 1148 can be similar to the stack device 1128. The second stack device 1148 can be mounted over the stack device 1128. For illustrative purposes, the second stack device 1148 can be depicted as wire bonded integrated circuit die although the second stack device 1148 can also be a flip chip die.

The integrated circuit packaging system 1100 can include an adhesive spacer 1150, which is defined as an adhesive layer for attaching components and devices. The adhesive spacer 1150 can be mounted on the second stack device 1148 for coupling the second stack device 1148 to the second substrate 1110. The adhesive spacer 1150 can include an epoxy molding compound (EMC), polymide compound, glue, molded under-fill encapsulation, or a wire-in-film (WIF) encapsulation.

The adhesive spacer 1150 can be formed on an interior portion of a top surface of the second stack device 1148 and away from the area along the perimeter of the top surface of the second stack device 1148. The second stack device 1148 can include a bond wire for electrically coupling the second stack device 1148 to the first substrate 1102. The bond wire can be mounted on the perimeter of the top surface of the second stack device 1148 without contacting the adhesive spacer 1150.

The second substrate 1110 can be mounted over the integrated circuit structure 1106. The second substrate 1110 can provide a similar function as the first substrate 1102 and can include conductive layers and conductive traces embedded therein. The second substrate 1110 can include a top side 1116 facing opposite to the first substrate 1102 and a bottom side 1118 facing opposite to the top side 1116.

The second substrate 1110 is depicted as having a smaller mounting area then the first substrate 1102 although the second substrate 1110 can be any size depending on the configuration of the integrated circuit packaging system 1100. For example, the second substrate 1110 can have an equal or larger mounting area than the first substrate 1102.

The second substrate 1110 can include a substrate non-horizontal side 1119, which is defined as a perimeter edge of the second substrate 1110 perpendicular to the top side 1116 and the bottom side 1118. The second substrate 1110 can include a non-periphery portion 1134, which is defined as an interior portion of the top side 1116 of the second substrate 1110 not including an area along a perimeter of the top side 1116. The non-periphery portion 1134 can be used to mount interconnects, components, substrates, devices, or packages thereon.

The second substrate 1110 can include a second substrate contact 1135, which is defined as a contact pad embedded within the second substrate 1110. The second substrate contact 1135 can provide an electrical connection to the second substrate 1110 from the top side 1116 and the bottom side 1118 of the second substrate 1110.

The vertical chip 1108 is defined as an integrated circuit die. The vertical chip 1108 can be directly coupled to the first substrate 1102 and adjacent to the integrated circuit structure 1106. The vertical chip 1108 can include a vertical chip active side 1136, a vertical chip stacking side 1138, and a vertical chip top side 1139.

The vertical chip active side 1136 is defined as the active side of the vertical chip 1108 with active circuitry fabricated thereon. The vertical chip stacking side 1138 is the side of the vertical chip 1108 stacked on a substrate and perpendicular to the vertical chip active side 1136. The vertical chip top side 1139 is the side of the vertical chip 1108 opposite to the vertical chip stacking side 1138.

The vertical chip 1108 can include a bond pad 1137 for providing an electrical connection from other components to the vertical chip 1108. The bond pad 1137 can be embedded on the vertical chip active side 1136 of the vertical chip 1108.

The vertical chip stacking side 1138 of the vertical chip 1108 can be directly attached to the component side 1112 of the first substrate 1102. The vertical chip active side 1136 of the vertical chip 1108 can be electrically connected to the second substrate 1110 by an arch interconnect 1140.

The vertical chip 1108 can include the arch interconnect 1140, which is defined as a conductive structure for electrically coupling the vertical chip 1108. The arch interconnect 1140 can electrically couple the bond pad 1137 to the substrate component contact 1105 of the first substrate 1102. The arch interconnect 1140 can electrically couple the bond pad 1137 to the second substrate contact 1135 of the second substrate 1110.

The vertical chip active side 1136 can be directly attached to the substrate non-horizontal side 1119 of the second substrate 1110. A portion of the vertical chip 1108 at an end towards the vertical chip top side 1139 can extend over the second substrate 1110.

The integrated circuit packaging system 1100 can include a package body 1142, which is defined as an encapsulation for hermetically sealing components from the environment. The package body 1142 can include an epoxy molding compound (EMC), polymide compound, molded under-fill encapsulation, or a wire-in-film (WIF) encapsulation. The package body 1142 can be formed on the first substrate 1102 and the second substrate 1110 and can encapsulate the integrated circuit structure 1106, the vertical chip 1108, the first structure interconnect 1126, and the arch interconnect 1140.

The package body 1142 can include a cavity 1144 exposing the non-periphery portion 1134 of the second substrate 1110 from the package body 1142. A top surface of the package body 1142 can be parallel to the top side 1116 of the second substrate 1110. The cavity 1144 within the package body 1142 can form a sidewall of the package body 1142 with a non-vertical slope from the top surface of the package body 1142 to the top side of the second substrate 1110. Components, devices, packages, or a combination thereof can be mounted on the non-periphery portion 1134 within the cavity 1144.

It has been discovered that the vertical chip 1108 attached to the first substrate 1102 and the second substrate 1110 can provide more integrated circuit dies available in a given package and more integrated circuit die available in a lower package profile. The vertical chip 1108 can converge the functions of support bumps and pillars and vertical interconnects into one structure for more efficiency in space saving. The configuration of the vertical chip 1108 on the first substrate 1102 and attached to the substrate non-horizontal side 1119 of the second substrate 1110 also provides a lower package profile than four integrated circuits mounted on top of each other.

Further, it has been discovered that the vertical chip 1108 and the arch interconnect 1140 provide more efficient vertical interconnections between vertical levels in the integrated circuit packaging system 1100 over vias and wire bonds. The vertical chip 1108 can be directly mounted to the first substrate 1102 and the second substrate 1110 for improved input/output (I/O) performance. More contacts with a narrow pitch can be made between the vertical chip 1108 and substrates because the vertical chip 1108 eliminates the problem of wire sweep of bond wires.

Figure 12:
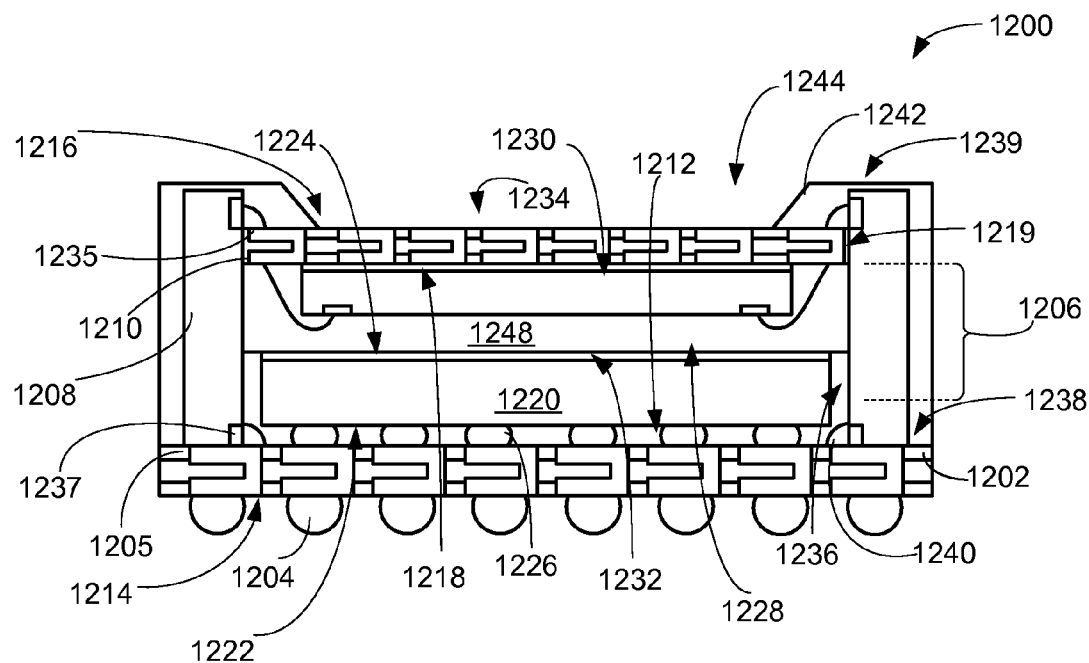
FIG. 12 is a cross-sectional view of an integrated circuit packaging system exemplified by the bottom view along line 1-1 of FIG. 2 in a fifth embodiment of the present invention.

Referring now to FIG. 12, therein is shown a cross-sectional view of an integrated circuit packaging system 1200 exemplified by the bottom view along line 1-1 of FIG. 2 in a fifth embodiment of the present invention. The integrated circuit packaging system 1200 can be similar to the integrated circuit packaging system 100 of FIG. 1 except the integrated circuit packaging system 1200 can include an integrated circuit package replacing the stack device 128 of FIG. 1.

The integrated circuit packaging system 1200 can include a first substrate 1202, a system interconnect 1204, an integrated circuit structure 1206, a vertical chip 1208, and a second substrate 1210.

The first substrate 1202 can provide support and connectivity for other components and devices. The first substrate 1202 can include conductive layers and conductive traces embedded therein. The first substrate 1202 can include a component side 1212 for mounting components, devices, and packages. The first substrate 1202 can also include a system side 1214, which is a side opposite to the component side 1212, for connecting to the next system level (not shown).

The system interconnect 1204 is defined as an electrical connector providing direct electrical and mechanical connection to the next system level. The system interconnect 1204 is attached to the system side 1214 of the first substrate 1202. As an example, the system interconnect 1204 can be a solder ball, a solder pillar, a bond wire, or a conductive bump.

The first substrate 1202 can include a substrate component contact 1205, which is defined as a conductive structure embedded within the first substrate 1202 and exposed from the first substrate 1202 on the component side 1212. The substrate component contact 1205 can provide an electrical connection between the system interconnect 1204 and components that are mounted over the first substrate 1202.

The integrated circuit structure 1206 is defined as a structure with at least one integrated circuit die and a device, component, package, or a combination thereof attached to the integrated circuit die. For example, the integrated circuit structure 1206 can be two or more stacked integrated circuit dies, an integrated circuit die stacked with a heat sink, an integrated circuit die stacked with an integrated circuit package, or a combination thereof.

The integrated circuit structure 1206 can include a base integrated circuit 1220, which is defined as an integrated circuit die. The base integrated circuit 1220 can include a flip chip die or a wire bonded die. The base integrated circuit 1220 can have a base active side 1222 with active circuitry fabricated thereon and a base inactive side 1224 opposite to the base active side 1222.

The integrated circuit structure 1206 can include a first structure interconnect 1226, which is defined as a conductive structure for providing an electrical connection. The first structure interconnect 1226 can be used to attach the base integrated circuit 1220 to the first substrate 1202. As an example, the first structure interconnect 1226 can be a solder ball, a solder pillars, a conductive bump, or a bond wire. The first structure interconnect 1226 can be directly attached to the base active side 1222 of the base integrated circuit 1220 for attaching the base integrated circuit 1220 to the substrate component contact 1205 of the first substrate 1202.

The integrated circuit structure 1206 can include a stack device 1228, which is defined as a component, an integrated circuit die, integrated circuit package, or a combination thereof for stacking over other dies, components, and packages. The stack device 1228 can include a flip chip die, a wire bonded die, or an integrated circuit package. The stack device 1228 can be mounted over the base integrated circuit 1220.

The stack device 1228 can have a stack inactive side 1230 and a stack active side 1232 opposite to the stack inactive side 1230. The stack inactive side 1230 is the side of the stack device 1228 facing the same direction as an inactive side of an integrated circuit of the stack device 1128. The stack inactive side 1230 can be attached to the second substrate 1210. The stack active side 1232 of the stack device 1228 can be facing the component side 1212.

The stack device 1228 can include bond wires for providing an electrical connection between the integrated circuit of the stack device and the second substrate 1210. The stack device 1228 can include an inner encapsulation 1248, which is defined as an encapsulation for hermetically sealing components from the environment.

The inner encapsulation 1248 can encapsulate the stack device 1228. The inner encapsulation 1248 can include an epoxy molding compound (EMC), polymide compound, molded under-fill encapsulation, or a wire-in-film (WIF) encapsulation. A surface of the inner encapsulation 1248 facing the component side 1212 can be attached to the base integrated circuit 1220 by an adhesive layer.

The second substrate 1210 can be mounted over the integrated circuit structure 1206. The second substrate 1210 can provide a similar function as the first substrate 1202 and can include conductive layers and conductive traces embedded therein. The second substrate 1210 can include a top side 1216 facing opposite to the first substrate 1202 and a bottom side 1218 facing opposite to the top side 1216.

The second substrate 1210 is depicted as having a smaller mounting area then the first substrate 1202 although the second substrate 1210 can be any size depending on the configuration of the integrated circuit packaging system 1200. For example, the second substrate 1210 can have an equal or larger mounting area than the first substrate 1202.

The second substrate 1210 can include a substrate non-horizontal side 1219, which is defined as a perimeter edge of the second substrate 1210 perpendicular to the top side 1216 and the bottom side 1218. The second substrate 1210 can include a non-periphery portion 1234, which is defined as an interior portion of the top side 1216 of the second substrate 1210 not including an area along a perimeter of the top side 1216. The non-periphery portion 1234 can be used to mount interconnects, components, substrates, devices, or packages thereon.

The second substrate 1210 can include a second substrate contact 1235, which is defined as a contact pad embedded within the second substrate 1210. The second substrate contact 1235 can provide an electrical connection to the second substrate 1210 from the top side 1216 and the bottom side 1218 of the second substrate 1210.

The vertical chip 1208 is defined as an integrated circuit die. The vertical chip 1208 can be directly coupled to the first substrate 1202 and adjacent to the integrated circuit structure 1206. The vertical chip 1208 can include a vertical chip active side 1236, a vertical chip stacking side 1238, and a vertical chip top side 1239.

The vertical chip active side 1236 is defined as the active side of the vertical chip 1208 with active circuitry fabricated thereon. The vertical chip stacking side 1238 is the side of the vertical chip 1208 stacked on a substrate and perpendicular to the vertical chip active side 1236. The vertical chip top side 1239 is the side of the vertical chip 1208 opposite to the vertical chip stacking side 1238.

The vertical chip 1208 can include a bond pad 1237 for providing an electrical connection from other components to the vertical chip 1208. The bond pad 1237 can be embedded on the vertical chip active side 1236 of the vertical chip 1208.

The vertical chip stacking side 1238 of the vertical chip 1208 can be directly attached to the component side 1212 of the first substrate 1202. The vertical chip active side 1236 of the vertical chip 1208 can be electrically connected to the second substrate 1210 by an arch interconnect 1240.

The vertical chip 1208 can include the arch interconnect 1240, which is defined as a conductive structure for electrically coupling the vertical chip 1208. The arch interconnect 1240 can electrically couple the bond pad 1237 to the substrate component contact 1205 of the first substrate 1202. The arch interconnect 1240 can electrically couple the bond pad 1237 to the second substrate contact 1235 of the second substrate 1210.

The vertical chip active side 1236 can be directly attached to the substrate non-horizontal side 1219 of the second substrate 1210. A portion of the vertical chip 1208 at an end towards the vertical chip top side 1239 can extend over the second substrate 1210.

The integrated circuit packaging system 1200 can include a package body 1242, which is defined as an encapsulation for hermetically sealing components from the environment. The package body 1242 can include an epoxy molding compound (EMC), polymide compound, molded under-fill encapsulation, or a wire-in-film (WIF) encapsulation. The package body 1242 can be formed on the first substrate 1202 and the second substrate 1210 and can encapsulate the integrated circuit structure 1206, the vertical chip 1208, the first structure interconnect 1226, and the arch interconnect 1240.

The package body 1242 can include a cavity 1244 exposing the non-periphery portion 1234 of the second substrate 1210 from the package body 1242. A top surface of the package body 1242 can be parallel to the top side 1216 of the second substrate 1210. The cavity 1244 within the package body 1242 can form a sidewall of the package body 1242 with a non-vertical slope from the top surface of the package body 1242 to the top side of the second substrate 1210. Components, devices, packages, or a combination thereof can be mounted on the non-periphery portion 1234 within the cavity 1244.

It has been discovered that the vertical chip 1208 attached to the first substrate 1202 and the second substrate 1210 can provide more integrated circuit dies available in a given package and more integrated circuit die available in a lower package profile. The vertical chip 1208 can converge the functions of support bumps and pillars and vertical interconnects into one structure for more efficiency in space saving. The configuration of the vertical chip 1208 on the first substrate 1202 and attached to the substrate non-horizontal side 1219 of the second substrate 1210 also provides a lower package profile than four integrated circuits mounted on top of each other.

Further, it has been discovered that the vertical chip 1208 and the arch interconnect 1240 provide more efficient vertical interconnections between vertical levels in the integrated circuit packaging system 1200 over vias and wire bonds. The vertical chip 1208 can be directly mounted to the first substrate 1202 and the second substrate 1210 for improved input/output (I/O) performance. More contacts with a narrow pitch can be made between the vertical chip 1208 and substrates because the vertical chip 1208 eliminates the problem of wire sweep of bond wires.

Referring now to FIG. 13, therein is shown a cross-sectional view of an integrated circuit packaging system 1300 exemplified by the bottom view along line 1-1 of FIG. 2 in a sixth embodiment of the present invention. The integrated circuit packaging system 1100 can be similar to the integrated circuit packaging system 100 of FIG. 1 except the integrated circuit packaging system 1300 does not have an integrated circuit die extending over a second substrate 1310.

The integrated circuit packaging system 1300 can include a first substrate 1302, a system interconnect 1304, an integrated circuit structure 1306, a vertical chip 1308, and the second substrate 1310.

The first substrate 1302 can provide support and connectivity for other components and devices. The first substrate 1302 can include conductive layers and conductive traces embedded therein. The first substrate 1302 can include a component side 1312 for mounting components, devices, and packages. The first substrate 1302 can also include a system side 1314, which is a side opposite to the component side 1312, for connecting to the next system level (not shown).

The system interconnect 1304 is defined as an electrical connector providing direct electrical and mechanical connection to the next system level. The system interconnect 1304 is attached to the system side 1314 of the first substrate 1302. As an example, the system interconnect 1304 can be a solder ball, a solder pillar, a bond wire, or a conductive bump.

The first substrate 1302 can include a substrate component contact 1305, which is defined as a conductive structure embedded within the first substrate 1302 and exposed from the first substrate 1302 on the component side 1312. The substrate component contact 1305 can provide an electrical connection between the system interconnect 1304 and components that are mounted over the first substrate 1302.

The integrated circuit structure 1306 is defined as a structure with at least one integrated circuit die and a device, component, package, or a combination thereof attached to the integrated circuit die. For example, the integrated circuit structure 1306 can be two or more stacked integrated circuit dies, an integrated circuit die stacked with a heat sink, an integrated circuit die stacked with an integrated circuit package, or a combination thereof.

The integrated circuit structure 1306 can include a base integrated circuit 1320, which is defined as an integrated circuit die. The base integrated circuit 1320 can include a flip chip die or a wire bonded die. The base integrated circuit 1320 can have a base active side 1322 with active circuitry fabricated thereon and a base inactive side 1324 opposite to the base active side 1322.

The integrated circuit structure 1306 can include a first structure interconnect 1326, which is defined as a conductive structure for providing an electrical connection. The first structure interconnect 1326 can be used to attach the base integrated circuit 1320 to the first substrate 1302. As an example, the first structure interconnect 1326 can be a solder ball, a solder pillars, a conductive bump, or a bond wire. The first structure interconnect 1326 can be directly attached to the base active side 1322 of the base integrated circuit 1320 for attaching the base integrated circuit 1320 to the substrate component contact 1305 of the first substrate 1302.

The integrated circuit structure 1306 can include a stack device 1328, which is defined as a component, an integrated circuit die, integrated circuit package, or a combination thereof for stacking over other dies, components, and packages. The stack device 1328 can include a flip chip die, a wire bonded die, or an integrated circuit package. The stack device 1328 can be mounted over the base integrated circuit 1320.

The stack device 1328 can have an interconnect side 1330 and an attach side 1332 opposite to the interconnect side 1330. The interconnect side 1330 can have interconnects, solder, or bond wires mounted thereon for connecting the stack device 1328 to another substrate, package, or die. The attach side 1332 can be attached to the base integrated circuit 1320. The attach side 1332 of the stack device 1328 can be attached to the base inactive side 1324 of the base integrated circuit 1320 by an adhesive layer.

The stack device 1328 can include a second structure interconnect 1333 directly attached to the interconnect side 1330 of the stack device 1328. The second structure interconnect 1333 is defined as a conductive structure for providing an electrical connection. The second structure interconnect 1333 can be used to attach the stack device 1328 to other components, substrates, devices, and packages. As an example, the second structure interconnect 1333 can be a solder ball, a solder pillars, a conductive bump, or a bond wire.

The second substrate 1310 can be mounted over the integrated circuit structure 1306. The second substrate 1310 can provide a similar function as the first substrate 1302 and can include conductive layers and conductive traces embedded therein. The second substrate 1310 can include a top side 1316 facing opposite to the first substrate 1302 and a bottom side 1318 facing opposite to the top side 1316.

The second substrate 1310 is depicted as having an equal mounting area as the first substrate 1302 although the second substrate 1310 can be any size depending on the configuration of the integrated circuit packaging system 1300. For example, the second substrate 1310 can have a smaller or larger mounting area than the first substrate 1302.

The second substrate 1310 can include a substrate non-horizontal side 1319, which is defined as a perimeter edge of the second substrate 1310 perpendicular to the top side 1316 and the bottom side 1318. The second substrate 1310 can include a non-periphery portion 1334, which is defined as an interior portion of the top side 1316 of the second substrate 1310 not including an area along a perimeter of the top side

1316. The non-periphery portion 1334 can be used to mount interconnects, components, substrates, devices, or packages thereon.

The second substrate 1310 can include a second substrate contact 1335, which is defined as a contact pad embedded within the second substrate 1310. The second substrate contact 1335 can provide an electrical connection to the second substrate 1310 from the top side 1316 and the bottom side 1318 of the second substrate 1310.

The vertical chip 1308 is defined as an integrated circuit die. The vertical chip 1308 can be directly coupled to the first substrate 1302 and adjacent to the integrated circuit structure 1306. The vertical chip 1308 can include a vertical chip active side 1336, a vertical chip stacking side 1338, and a vertical chip top side 1339.

The vertical chip active side 1336 is defined as the active side of the vertical chip 1308 with active circuitry fabricated thereon. The vertical chip stacking side 1338 is the side of the vertical chip 1308 stacked on a substrate and perpendicular to the vertical chip active side 1336. The vertical chip top side 1339 is the side of the vertical chip 1308 opposite to the vertical chip stacking side 1338.

The vertical chip 1308 can include a bond pad 1337 for providing an electrical connection from other components to the vertical chip 1308. The bond pad 1337 can be embedded on the vertical chip active side 1336 of the vertical chip 1308.

The vertical chip stacking side 1338 of the vertical chip 1308 can be directly attached to the component side 1312 of the first substrate 1302. The vertical chip active side 1336 of the vertical chip 1308 can be electrically connected to the second substrate 1310 by an arch interconnect 1340.

The vertical chip 1308 can include the arch interconnect 1340, which is defined as a conductive structure for electrically coupling the vertical chip 1308. The arch interconnect 1340 can electrically couple the bond pad 1337 to the substrate component contact 1305 of the first substrate 1302. The arch interconnect 1340 can electrically couple the bond pad 1337 to the second substrate contact 1335 of the second substrate 1310.

The integrated circuit packaging system 1300 can include a package body 1342, which is defined as an encapsulation for hermetically sealing components from the environment. The package body 1342 can include an epoxy molding compound (EMC), polymide compound, molded under-fill encapsulation, or a wire-in-film (WIF) encapsulation. The package body 1342 can be formed on the first substrate 1302 and the second substrate 1310 and can encapsulate the integrated circuit structure 1306, the vertical chip 1308, the first structure interconnect 1326, and the arch interconnect 1340.

It has been discovered that the vertical chip 1308 attached to the first substrate 1302 and the second substrate 1310 can provide more integrated circuit dies available in a given package and more integrated circuit die available in a lower package profile. The vertical chip 1308 can converge the functions of support bumps and pillars and vertical interconnects into one structure for more efficiency in space saving. The configuration of the vertical chip 1308 on the first substrate 1302 and attached to the substrate non-horizontal side 1319 of the second substrate 1310 also provides a lower package profile than four integrated circuits mounted on top of each other.

Further, it has been discovered that the vertical chip 1308 and the arch interconnect 1340 provide more efficient vertical interconnections between vertical levels in the integrated circuit packaging system 1300 over vias and wire bonds. The vertical chip 1308 can be directly mounted to the first substrate 1302 and the second substrate 1310 for improved input/output (I/O) performance. More contacts with a narrow pitch can be made between the vertical chip 1308 and substrates because the vertical chip 1308 eliminates the problem of wire sweep of bond wires.

Referring now to FIG. 14 therein is shown a flow chart of a method 1400 of manufacture of the integrated circuit packaging system 100 in a further embodiment of the present invention. The method 1400 includes: providing a first substrate in a block 1402; mounting an integrated circuit structure on the first substrate in a block 1404; mounting a second substrate on the integrated circuit structure in a block 1406; coupling a vertical chip to the first substrate and to the second substrate in a block 1408; and forming a package body for encapsulating the integrated circuit structure, the vertical chip, and a portion of the second substrate in a block 1410.

Thus, it has been discovered that the integrated circuit packaging system of the present invention furnishes important and heretofore unknown and unavailable solutions, capabilities, and functional aspects for mold interlock. The resulting method, process, apparatus, device, product, and/or system is straightforward, cost-effective, uncomplicated, highly versatile and effective, can be surprisingly and non-obviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
providing a first substrate having a first substrate non-horizontal side;
mounting an integrated circuit structure on the first substrate including:
mounting a base integrated circuit on the first substrate,
attaching an adhesive layer directly on the base integrated circuit, and
mounting a stack device directly on the adhesive layer;
mounting a second substrate on the integrated circuit structure, the second substrate includes conductive layers and conductive traces embedded within the second substrate;
coupling a vertical chip to the first substrate and to the second substrate, the vertical chip having a bond pad, a vertical chip stacking side, and a vertical chip outer side, the vertical chip outer side facing away from the bond pad and perpendicular to the vertical chip stacking side directly on a component side of the first substrate, the bond pad coupled to the first substrate and the second substrate with an arch interconnect, the arch interconnect in direct contact with the bond pad and a top side of the second substrate;

coupling a second vertical chip on the component side and attached to the second substrate, the second vertical chip positioned on the opposite side of the integrated circuit structure; and forming a package body for encapsulating the integrated circuit structure, the vertical chip, and a portion of the second substrate, the package body having a cavity between the vertical chip and the second vertical chip, the package body directly on the vertical chip outer side and having a package body outer sidewall coplanar with the first substrate non-horizontal side.

2. The method as claimed in claim 1 wherein coupling the vertical chip includes coupling the vertical chip with a portion of the vertical chip extending above the second substrate.

3. The method as claimed in claim 1 wherein coupling the vertical chip includes forming the arch interconnect for electrically coupling the bond pad to the first substrate.

4. The method as claimed in claim 1 wherein:
mounting the second substrate includes mounting the second substrate having a second substrate contact; and
coupling the vertical chip includes attaching the vertical chip to the second substrate contact for supporting the second substrate.

5. The method as claimed in claim 1 wherein forming the package body includes forming the cavity in the package body, the cavity exposing a non-periphery portion of the second substrate.

6. A method of manufacture of an integrated circuit packaging system comprising:
providing a first substrate having a component side and a first substrate non-horizontal side;
mounting an integrated circuit structure on the component side including:
mounting a base integrated circuit on the first substrate,
attaching an adhesive layer directly on the base integrated circuit, and
mounting a stack device directly on the adhesive layer;
mounting a second substrate, having a substrate non-horizontal side and a second substrate contact, on the integrated circuit structure, the second substrate includes conductive layers and conductive traces embedded within the second substrate;
coupling a vertical chip on the component side and attached to the second substrate, the vertical chip having a bond pad, a vertical chip stacking side, and a vertical chip outer side, the vertical chip outer side facing away from the bond pad and perpendicular to the vertical chip stacking side directly on the component side of the first substrate, the bond pad coupled to the first substrate and the second substrate with an arch interconnect, the arch interconnect in direct contact with the bond pad and a top side of the second substrate contact;
coupling a second vertical chip on the component side and attached to the second substrate, the second vertical chip positioned on the opposite side of the integrated circuit structure; and
forming a package body for encapsulating the component side, the integrated circuit structure, the vertical chip, and a portion of the second substrate, the package body having a cavity between the vertical chip and the second vertical chip, the package body directly on the vertical chip outer side and having a package body outer sidewall coplanar with the first substrate non-horizontal side.

7. The method as claimed in claim 6 further comprising electrically coupling the second vertical chip to the second substrate contact.

8. The method as claimed in claim 6 wherein coupling the vertical chip includes attaching the vertical chip to the substrate non-horizontal side.

9. The method as claimed in claim 6 wherein mounting the integrated circuit structure includes:
mounting the base integrated circuit on the component side of the first substrate; and
attaching the stack device to the second substrate.

10. The method as claimed in claim 6 wherein mounting the integrated circuit structure includes a second stack device over the stack device.

11. An integrated circuit packaging system comprising:
a first substrate having a first substrate non-horizontal side;
an integrated circuit structure mounted on the first substrate, the integrated circuit structure includes:
a base integrated circuit on the first substrate,
an adhesive layer directly on the base integrated circuit, and
a stack device directly on the adhesive layer;
a second substrate mounted on the integrated circuit structure, the second substrate includes conductive layers and conductive traces embedded within the second substrate;
a vertical chip, having a bond pad, a vertical chip stacking side, and a vertical chip outer side, the vertical chip outer side facing away from the bond pad and perpendicular to the vertical chip stacking side directly on a component side of the first substrate, the bond pad coupled to the first substrate and to the second substrate with an arch interconnect, the arch interconnect in direct contact with the bond pad and a top side of the second substrate;
a second vertical chip on the component side and attached to the second substrate, the second vertical chip positioned on the opposite side of the integrated circuit structure; and
a package body for encapsulating the integrated circuit structure, the vertical chip, and a portion of the second substrate, the package body having a cavity between the vertical chip and the second vertical chip, the package body directly on the vertical chip outer side and having a package body outer sidewall coplanar with the first substrate non-horizontal side.

12. The system as claimed in claim 11 wherein the vertical chip includes a portion of the vertical chip extending above the second substrate.

13. The system as claimed in claim 11 wherein the vertical chip includes the arch interconnect for electrically coupling the bond pad to the first substrate.

14. The system as claimed in claim 11 wherein:
the second substrate includes a second substrate contact; and
the vertical chip is attached to the second substrate contact for supporting the second substrate.

15. The system as claimed in claim 11 wherein the package body includes the cavity exposing a non-periphery portion of the second substrate.

16. The system as claimed in claim 11 wherein:
the integrated circuit structure is mounted on the component side;

the second substrate includes a substrate non-horizontal side and a second substrate contact;

the vertical chip is attached to the component side and the second substrate contact; and the package body encapsulates the component side.

17. The system as claimed in claim 16 wherein the second vertical chip is electrically coupled to the second substrate contact.

18. The system as claimed in claim 16 wherein the vertical chip is attached to the substrate non-horizontal side.

19. The system as claimed in claim 16 wherein the integrated circuit structure includes:

the base integrated circuit on the component side; and the stack device attached to the second substrate.

20. The system as claimed in claim 16 wherein the integrated circuit structure includes a second stack device over the stack device.

* * * * *